US007239080B2

(12) United States Patent
Ng et al.

(10) Patent No.: US 7,239,080 B2
(45) Date of Patent: Jul. 3, 2007

(54) LED DISPLAY WITH OVERLAY

(75) Inventors: Kee-Yean Ng, Penang (MY); Heng Yow Cheng, Penang (MY); Chee Wai Chia, Penang (MY)

(73) Assignee: Avago Technologies ECBU IP (Singapore) Pte. Ltd, Singapore (SG)

( * ) Notice: Subject to any disclaimer, the term of this patent is extended or adjusted under 35 U.S.C. 154(b) by 184 days.

(21) Appl. No.: 10/798,477

(22) Filed: Mar. 11, 2004

(65) Prior Publication Data

US 2005/0200269 A1    Sep. 15, 2005

(51) Int. Cl.
    *H01J 1/62* (2006.01)
    *H01J 63/04* (2006.01)

(52) U.S. Cl. ............... 313/502; 313/498; 313/503; 313/512

(58) Field of Classification Search ........ 313/498, 313/500, 502, 503, 504, 512; 257/98, 99, 257/100
See application file for complete search history.

(56) References Cited

U.S. PATENT DOCUMENTS

| | | | |
|---|---|---|---|
| 5,959,316 A * | 9/1999 | Lowery ............... 257/98 |
| 6,066,861 A * | 5/2000 | Hohn et al. ........... 257/99 |
| 6,521,915 B2 * | 2/2003 | Odaki et al. .......... 257/98 |
| 6,576,930 B2 * | 6/2003 | Reeh et al. ........... 257/98 |
| 6,649,946 B2 * | 11/2003 | Bogner et al. ........ 257/233 |
| 6,734,465 B1 * | 5/2004 | Taskar et al. ......... 257/80 |
| 6,774,401 B2 * | 8/2004 | Nakada et al. ........ 257/82 |
| 6,774,406 B2 * | 8/2004 | Isoda ................ 257/99 |
| 6,791,259 B1 * | 9/2004 | Stokes et al. ......... 313/503 |
| 6,936,857 B2 * | 8/2005 | Doxsee et al. ........ 257/89 |

* cited by examiner

*Primary Examiner*—Sikha Roy
*Assistant Examiner*—Kevin Quarterman

(57) ABSTRACT

A light emitting diode (LED) display device comprises a substrate and a plurality of walls disposed on the substrate, the plurality of walls forming a cavity, the cavity being filled with an encapsulant not including fluorescent material. An LED is disposed on a first portion of the substrate within the cavity. An electrical connection exists between the LED and a second portion of the substrate, and a fluorescent material overlay is located at a top end of the cavity. The LED display device alternatively includes a plurality of LEDs, wherein each LED is disposed within a separate cavity.

20 Claims, 2 Drawing Sheets

LED DISPLAY WITH OVERLAY

FIELD OF THE INVENTION

This invention relates to light emitting devices and particularly to a light emitting diode (LED) display with an overlay layer of wavelength converting material.

BACKGROUND OF THE INVENTION

Light emitting diode display devices are useful for a variety of display applications. Known display devices use an LED to excite a wavelength or color converting material, such as a fluorescent or luminescent material, and then combine the emission of the fluorescent or luminescent material with the unconverted first emission from the LED. However, while these known LED display devices perform well with a single-LED device, known multi-LED devices have difficulty maintaining color consistency. Accordingly, there remains a need for a device that addresses existing shortcomings relating to multiple-LED displays.

SUMMARY OF THE INVENTION

According to one embodiment of the present invention, a light emitting diode display device is disclosed. The device comprises a substrate, a plurality of walls disposed on the substrate, the plurality of walls forming a cavity, the cavity being filled with an encapsulant, the encapsulant not including fluorescent material, an LED disposed on a first portion of the substrate within the cavity, an electrical connection between the LED and a second portion of the substrate, and a fluorescent material overlay at a top end of the cavity.

According to a second embodiment of the present invention, a light emitting diode display device is disclosed. The device comprises a substrate, a plurality of walls disposed on the substrate, the plurality of walls forming a cavity, an LED disposed on a first portion of the substrate within the cavity, an electrical connection between the LED and a second portion of the substrate, and a fluorescent material overlay at a top end of the cavity, the fluorescent material overlay including a plastic layer and a layer of fluorescent material.

According to a third embodiment of the present invention, a light emitting diode display device is disclosed. The device comprises a substrate, a plurality of cavities, each of the plurality of cavities formed within a plurality of walls disposed on the substrate, a plurality of LEDs, each of the plurality of LEDs disposed within a separate one of the plurality of cavities, each of the plurality of LEDs disposed on a first portion of the substrate, a plurality of electrical connections, each of the plurality of electrical connections connecting one of the plurality of LEDs to one or more respective second portions of the substrate, and a fluorescent material overlay at a top end of the plurality of cavities.

DETAILED DESCRIPTION

Figure 1:
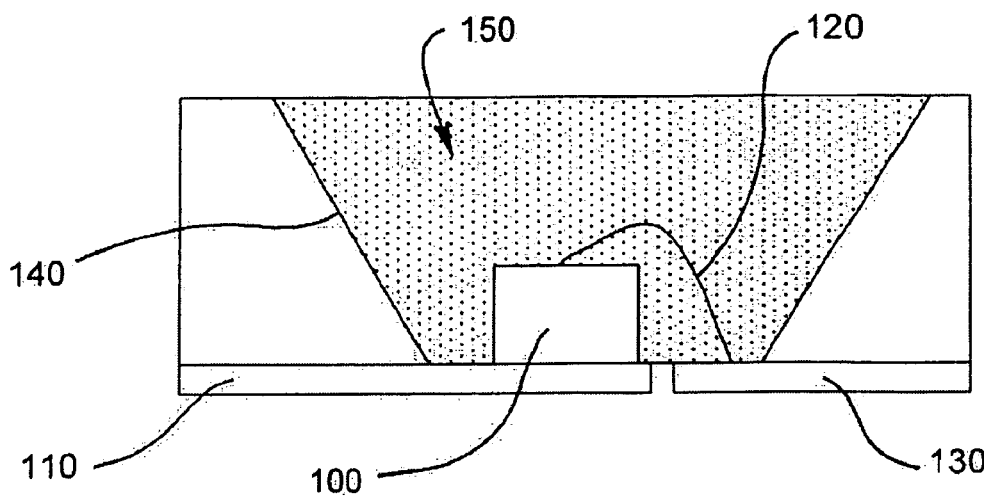
FIG. 1 is a cross-sectional view of a prior art device showing a fluorescent or luminescent material used in combination with an LED.

Referring to FIG. 1, a cross-section view of a prior art device shows a fluorescent or luminescent material used in combination with an LED 100. The LED 100 is placed on a first portion 110 of a substrate. An electrical connection 120 is made from the LED 100 to a second portion 130 of the substrate. The LED 100 is generally placed in a cavity or cup 140 having a reflective wall. An encapsulant 150 fills the cavity to protect the LED 100, the electrical connection 120, and the substrate. Particles of the fluorescent or luminescent material are dispersed within the encapsulant. One known fluorescent or luminescent material used in LED display devices is phosphor.

When an electrical current passes through the LED 100, the LED radiates light. The phosphor particles in the encapsulant absorb a portion of the radiation of light from the LED 100 and then emit a radiation of light of a different color. The resultant color that emerges from the cavity is a combination of both the LED emitted light and the phosphor emitted light. One known combination in the prior art is the use of a blue LED and a yellow phosphor to emit a white light.

Figure 2:
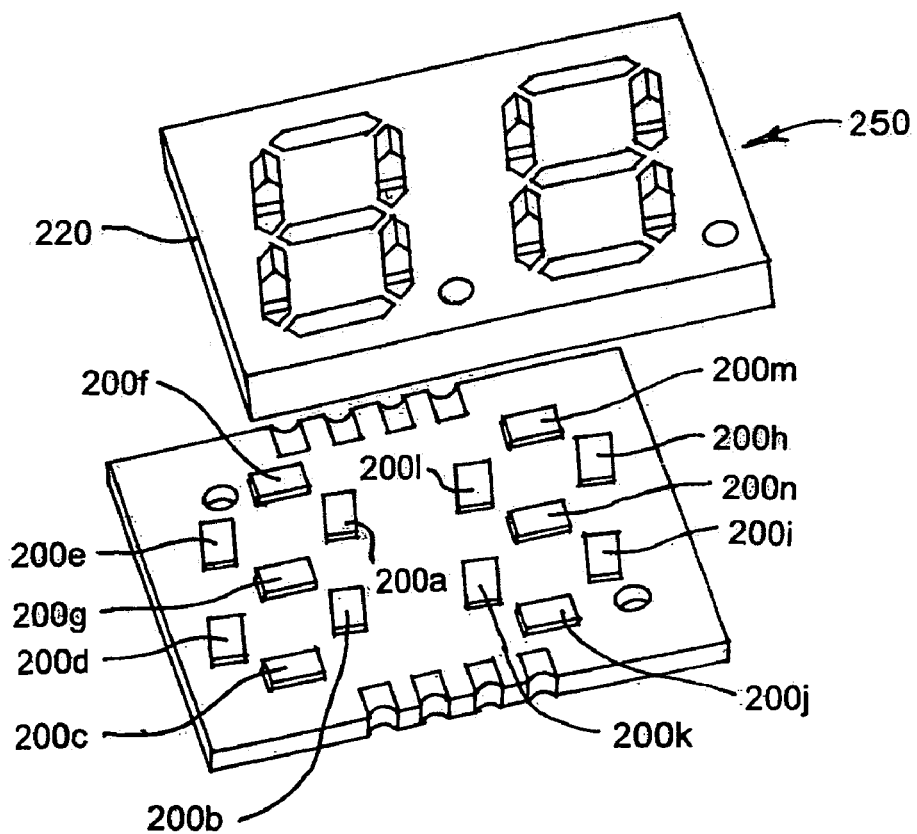
FIG. 2 is a prior art display using multiple LEDs.

FIG. 2 shows one prior art display 250 using multiple LEDs. In FIG. 2, LEDs 200a-200n, are attached or disposed onto a substrate. The substrate is placed inside a reflector 220 that has multiple cavities corresponding to each of the LEDs. An encapsulant (not shown) embedded with phosphor (not shown) fills each of the cavities. In such an arrangement, each of the cavities may not have the same dimensions. Therefore, the quantity of the phosphor particles and their dispersion within each cavity may be different and cause color variation among the cavities.

Figure 3:
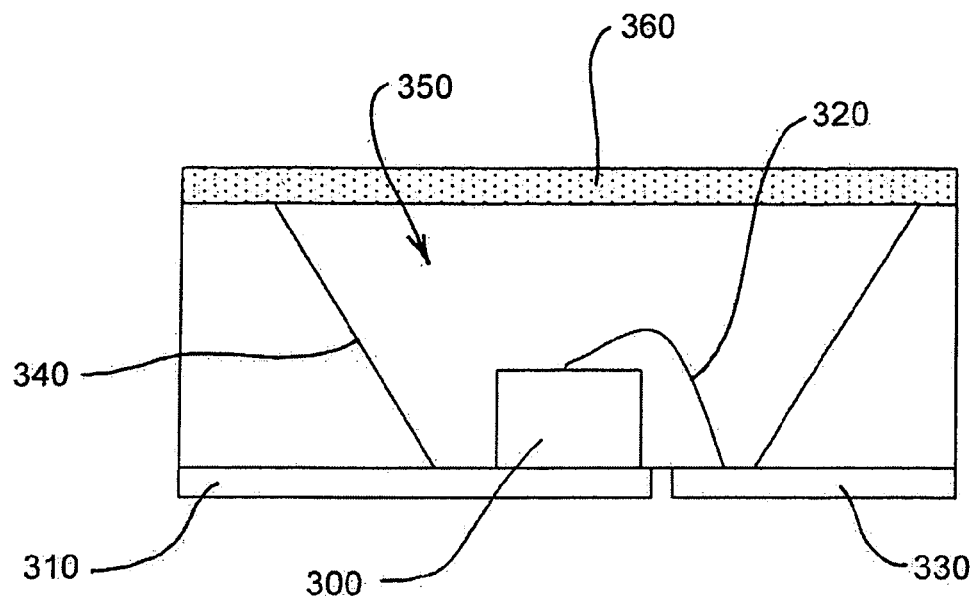
FIG. 3 is a cross-sectional view of an LED device according to an embodiment of the present invention.

Referring to FIG. 3, a cross-section view of an LED device, according to an embodiment of the present invention, is shown. An LED 300 is attached or disposed on a first portion 310 of a substrate. An electrical connection 320 is made from the LED to a second portion 330 of the substrate. The LED 300 is shown located toward the bottom of a cavity or cup 340. The cavity 340 is formed within a plurality of walls disposed on or above the substrate. The cavity 340 may include reflective walls. The cavity may be filled with an encapsulant 350 to protect the LED 300. A fluorescent material overlay 360 is located at or near the top of the cavity 340, on the end of the cavity opposing the LED 300.

In the embodiment illustrated in FIG. 3, when an electrical current passes through the LED 300, the LED 300 emits a radiation. The fluorescent material overlay 360 absorbs a portion of the LED radiation and emits a fluorescent material radiation. The resultant perceived color is a combination of the fluorescent material radiation and the unabsorbed portion of the LED radiation.

According to one embodiment of the present invention, the LED 300 emits a blue radiation and the fluorescent material overlay 360 emits a yellow radiation. The combination of the blue and yellow radiation may produce a white light. The thickness of the fluorescent material overlay 360 may be varied to produce a desired ratio of the LED radiation to the fluorescent material radiation, thereby creating different shades of white such as, for example, a bluish-white to yellowish-white.

According to another embodiment, the LED 300 emits a blue radiation and the fluorescent material overlay 360 emits a green radiation. The combination of the blue and green radiation may produce a cyan light. The thickness of the fluorescent material overlay 360 may be varied to produce a desired ratio of the LED radiation to the fluorescent material radiation, thereby creating colors ranging from blue to green.

The above color combinations are given for purposes of illustration. Any suitable color combinations of LED radiation and fluorescent material radiation may be used to achieve the desired purpose and effect. For example, a UV or green LED may be used. Also, a fluorescent material that emits green or red may be used. Any suitable color combinations are to be within the scope of the present invention.

According to another embodiment, the LED radiation is substantially fully converted into fluorescent material radiation. Accordingly, there is little or no combination of LED radiated light and fluorescent material radiated light, and the light emitted from the LED device is substantially that emitted by the fluorescent material. For example, where an ultra-violet (UV) LED is used in an LED display device, it is desirable that potentially harmful UV radiation is not emitted from the display.

According to yet another embodiment of the present invention, a blend of two or more fluorescent material types may be used in the fluorescent material overlay 360. Such a combination of multiple fluorescent material types may be used to create novel eye-catching colors. The blend of two or more fluorescent material types may be intermixed homogeneously in the fluorescent material overlay, laid down in a pixel manner, or combined in any suitable manner. In the pixel manner of combination, the fluorescent material overlay may include distinct pixels of each fluorescent material type combined in a repeatable pattern. For example, the overlay may include repeated pixels of red, green and blue fluorescent material.

According to another embodiment of the present invention, a fabrication of a multi-LED display is provided. In a multiple-LED display device including multiple cavities, color inconsistencies between separate cavities of the multiple-LED devices may be reduced, minimized, or eliminated. One multi-LED display device includes a substrate, a plurality of cavities, each of the plurality of cavities formed within a plurality of walls disposed on the substrate, a plurality of LEDs, each of the plurality of LEDs disposed within a separate one of the plurality of cavities, each of the plurality of LEDs disposed on a first portion of the substrate, a plurality of electrical connections, each of the plurality of electrical connections connecting one of the plurality of LEDs to one or more respective second portions of the substrate, and a fluorescent material overlay at a top end of the plurality of cavities. The electrical connections may be made to provide the desired control of the LEDs. For example, the electrical connections may be made such that each LED is controlled separately, or such that one or more subsets of the plurality of LEDs are controlled together.

The fluorescent material overlay 360 may have a different type of fluorescent material at locations corresponding to the separate cavities of the display device. Therefore, different cavities will produce different colors according to the type of fluorescent material at the particular cavity location. In the multi-LED embodiment, one or more fluorescent material overlays may be used. For example, each cavity, or one or more subsets of the plurality of cavities may each have a separate fluorescent material overlay.

According to one embodiment of the invention, the fluorescent material overlay 360 has a substantially consistent thickness and a substantially uniform matrix of fluorescent material or fluorescent particles. By having a substantially consistent thickness, the proportion of the LED radiation that is converted to the fluorescent material radiation is kept generally constant, and, for each LED 300 and associated cavity 340, the amount of the LED radiation absorbed by the fluorescent material overlay 360 will be substantially the same, even if the sizes of the cavities 340 are different.

According to another embodiment, the fluorescent material overlay 360 may have the shape of the cavity 340 opening. Also, the area of fluorescent material in the overlay 360 may be shaped such that only a portion of the overlay includes fluorescent material. Also, the LED device may also include micro-features or micro-structures, such as dots, indentations, or lenses, disposed on the overlay 360 or at the top end of the cavity 340.

According to another embodiment, the fluorescent material overlay 360 is a layer independent from the encapsulant 350 and abutting the encapsulant 350. The fluorescent material overlay 360 may occupy a layer of the top end of the cavity 340. The fluorescent material overlay 360 may also be substantially outside of the cavity 340. Accordingly, the amount of fluorescent material in the fluorescent material overlay 360 may be substantially independent from the volume of the cavity 340.

According to one embodiment, the encapsulant does not include fluorescent material, or the encapsulant is substantially free from phosphor or fluorescent material such that the encapsulant does not affect the resulting color of the LED display. According to another embodiment of the present invention, the cavity of the display device may not necessarily be filled with an encapsulant, as other suitable methods of protecting the LED may be used.

The fluorescent material overlay 360 may be fabricated using any suitable method. One example fabrication process is a plastic sheet forming process such as, for example, injection molding, rolling, casting, laminating, and other suitable processes. In the case of plastic sheet forming, the fluorescent material is mixed into the plastic material. Examples of plastic materials that may be used include polycarbonate, polypropylene, polyethylene, polyester, polymethyl methacrylate, silicone, and other suitable thermoplastics or thermoset polymers. In accordance with another embodiment, inorganic glass films may also be used.

Figure 4:
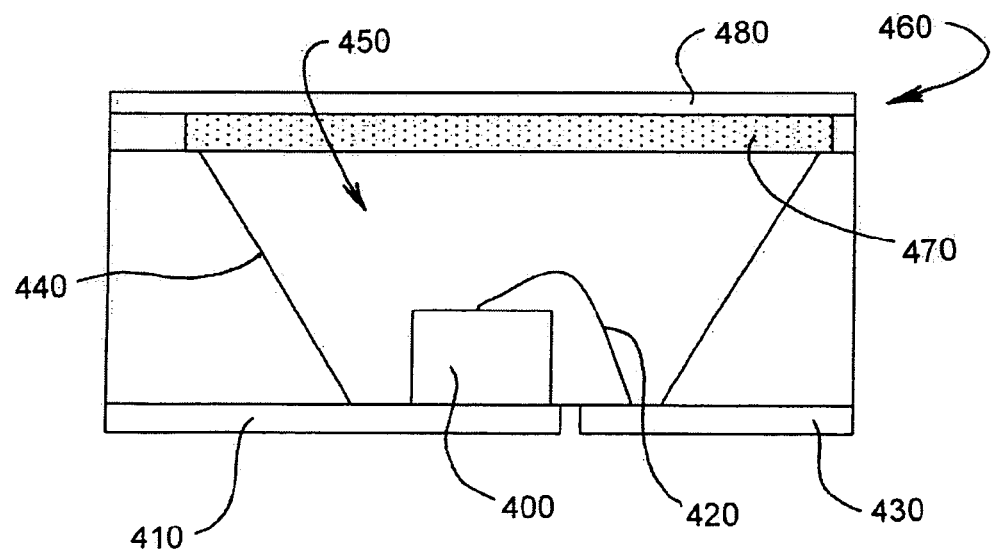
FIG. 4 is a cross-sectional view of an LED device according to a second embodiment of the present invention.

Referring now to FIG. 4, a cross-section view of an LED device, according to a second embodiment of the present invention, is shown. An LED 400 is attached or disposed on a first portion 410 of a substrate. An electrical connection 420 is made from the LED to a second portion 430 of the substrate. The LED 400 is shown located toward the bottom of a cavity or cup 440. The cavity 440 is disposed on or above the substrate. The cavity 440 may include a reflective wall. The cavity may be filled with an encapsulant 450 to protect the LED 400. A fluorescent material overlay 460 is located at or near the top of the cavity 440, on the side of the cavity opposing the LED 400. In the second embodiment, the fluorescent material overlay 460 includes a layer of fluorescent material 470 or phosphor particles laid down on one side of a plastic layer 480 using an adhesive or other method of joining the layer of fluorescent material 470 or phosphor particles to the plastic layer 480. The layer of fluorescent material 470 or phosphor particles maybe be disposed on either side or on both sides of the plastic layer 480. The plastic layer 480 may be any suitable plastic material, glass films, or other suitable materials.

In an alternative embodiment, the layer of fluorescent material is laminated between a first plastic layer and a second plastic layer such that the layer of fluorescent particles is sandwiched between the first plastic layer and the second plastic layer.

In one embodiment, the fluorescent material includes inorganic phosphor, and the inorganic phosphor may include inorganic phosphor particles. Example inorganic phosphor materials include, but are not limited to, Cerium activated Yttrium Aluminium Garnet (YAG:Ce) and Europium activated Strontium Thiogallate (SrTg:Eu). One example of a nano-phosphor is Zinc Cadmium (ZnCd). Other suitable fluorescent or luminescent materials may be used including organic dyes, for example, DCM (4-Dicyanmethylene-2-methyl-6-(p-dimethylaminostyryl)-4H-pyran), expressed chemically as $C_{19}H_{17}N_3$. Such an organic material is available from Lambda Physik, Inc. of Fort Lauderdale, Fla. Other suitable inorganic and organic materials are known by those skilled in the art.

Any suitable size of fluorescent particles can be used. The size of the fluorescent particle used may vary depending on the thickness of the fluorescent material overlay. In one embodiment, the fluorescent particles have a mean diameter $d_{50}$ ranging from approximately 10 nanometer to approximately 100 micrometer. In another embodiment, the fluorescent particles have a mean diameter $d_{50}$ ranging from approximately 1 micrometer to approximately 50 micrometer. In yet another embodiment, nano-size particles may be used. In one embodiment, the nano-size particles have a mean diameter $d_{50}$ ranging from approximately 10 nanometer to approximately 100 nanometer.

While the embodiments of the present invention have been illustrated in detail, it should be apparent that modifications and adaptations to these embodiments may occur to one skilled in the art without departing from the scope of the present invention as set forth in the following claims.

The invention claimed is:

1. A light emitting diode (LED) display device comprising:
   a substrate;
   a plurality of walls disposed on the substrate, the plurality of walls forming a cavity, the cavity being filled with an encapsulant, the encapsulant not including fluorescent material;
   an LED disposed on a first portion of the substrate within the cavity;
   an electrical connection between the LED and a second portion of the substrate;
   and a fluorescent material overlay at a top end of the cavity, wherein the fluorescent material overlay has a thickness that substantially fully converts all light emitted from the LED to fluorescent radiation.

2. A light emitting diode display device according to claim 1, wherein the fluorescent material overlay includes a layer of phosphor particles.

3. A light emitting diode display device according to claim 1, wherein the fluorescent material overlay has a substantially consistent thickness and includes a substantially uniform matrix of phosphor particles.

4. A light emitting diode display device according to claim 1, wherein the fluorescent material overlay includes a combination of two or more fluorescent material types.

5. A light emitting diode display device according to claim 1, wherein the fluorescent material overlay includes phosphor particles having a mean diameter within the range of 1 micrometer to 50 micrometer.

6. A light emitting diode display device according to claim 1, wherein the fluorescent material overlay includes phosphor particles having a mean diameter within the range of 10 nanometer to 100 nanometer.

7. A light emitting diode display device according to claim 1, wherein the fluorescent material overlay includes organic dye.

8. A light emitting diode (LED) display device comprising:
   a substrate;
   a plurality of walls disposed on the substrate, the plurality of walls forming a cavity;
   an LED disposed on a first portion of the substrate within the cavity;
   an electrical connection between the LED and a second portion of the substrate; and
   a fluorescent material overlay extending over an area at a top end of the cavity, wherein only a first portion of the fluorescent material overlay area includes fluorescent material and wherein a second portion of the fluorescent material overlay area co-extensive with the first portion does not have any fluorescent material.

9. A light emitting diode display device according to claim 8, wherein the fluorescent material overlay has a substantially consistent thickness and includes a uniform matrix of phosphor particles.

10. A light emitting diode display device according to claim 8, wherein the fluorescent material overlay includes a combination of two or more fluorescent material types.

11. A light emitting diode display device according to claim 8, wherein the fluorescent material overlay includes phosphor particles having a mean diameter within the range of 1 micrometer to 50 micrometer.

12. A light emitting diode display device according to claim 8, wherein the fluorescent material overlay includes phosphor particles having a mean diameter within the range of 10 nanometer to 100 nanometer.

13. A light emitting diode display device according to claim 8, wherein the fluorescent material overlay includes organic dye.

14. A light emitting diode (LED) display device comprising:
   a substrate;
   a plurality of cavities, each of the plurality of cavities formed within a plurality of walls disposed on the substrate;
   a plurality of LEDs, each of the plurality of LEDs disposed within a separate one of the plurality of cavities, each of the plurality of LEDs disposed on a first portion of the substrate;
   a plurality of electrical connections, each of the plurality of electrical connections connecting one of the plurality of LEDs to one or more respective second portions of the substrate; and
   a single fluorescent material overlay at a top end of the plurality of cavities.

15. A light emitting diode display device according to claim 14, wherein the fluorescent material overlay includes a layer of phosphor particles.

16. A light emitting diode display device according to claim 14, wherein the fluorescent material overlay has a substantially consistent thickness and includes a substantially uniform matrix of phosphor particles.

17. A light emitting diode display device according to claim 14, wherein the fluorescent material overlay includes phosphor particles having a mean diameter within the range of 1 micrometer to 50 micrometer.

18. A light emitting diode display device according to claim 14, wherein the fluorescent material overlay includes phosphor particles having a mean diameter within the range of 10 nanometer to 100 nanometer.

19. A light emitting diode display device according to claim 14, wherein the fluorescent material overlay includes organic dye.

20. A light emitting diode display device according to claim 14, wherein the fluorescent material overlay include a plurality of fluorescent material types, and each of the plurality of fluorescent material types is included in a corresponding portion or portions of the plurality of cavities.

* * * * *